United States Patent [19]

Misawa

[11] Patent Number: 5,470,789
[45] Date of Patent: Nov. 28, 1995

[54] PROCESS FOR FABRICATING INTEGRATED CIRCUIT DEVICES

[75] Inventor: Nobuhiro Misawa, Kawasaki, Japan

[73] Assignee: Fujitsu Limited, Kawasaki, Japan

[21] Appl. No.: 400,504

[22] Filed: Mar. 7, 1995

Related U.S. Application Data

[63] Continuation of Ser. No. 204,986, Mar. 2, 1994, abandoned.

[30] Foreign Application Priority Data

Mar. 19, 1993 [JP] Japan ................................. 5-059889

[51] Int. Cl.$^6$ ..................................... H01L 21/44
[52] U.S. Cl. ........................ 437/190; 437/189; 437/192; 437/195; 437/203
[58] Field of Search .................... 437/195, 192, 437/203, 190, 189

[56] References Cited

U.S. PATENT DOCUMENTS

| | | | |
|---|---|---|---|
| 5,008,216 | 4/1991 | Huang et al. | 437/195 |
| 5,071,789 | 12/1991 | Nakata | 437/192 |
| 5,084,413 | 1/1992 | Fujita et al. | 437/192 |
| 5,130,274 | 7/1992 | Harper et al. | 437/195 |
| 5,164,330 | 11/1992 | Davis et al. | 437/192 |
| 5,219,789 | 6/1993 | Adan | 437/192 |
| 5,254,498 | 10/1993 | Sumi | 437/192 |
| 5,262,354 | 11/1993 | Cote et al. | 437/195 |

*Primary Examiner*—Kevin M. Picardat
*Attorney, Agent, or Firm*—Armstrong, Westerman, Hattori, McLeland & Naughton

[57] ABSTRACT

A process for fabricating an integrated circuit device comprises a first step of forming an opening in an insulating layer formed on a substrate, a second step of depositing a copper layer on the substrate including the opening, a third step of abrading the copper layer to remove the copper layer deposited on the insulating layer, while part of the copper layer deposited in the opening is removed until the upper surface of said part becomes lower than the upper surface of the insulating layer, a fourth step of depositing a barrier layer on the substrate including the copper layer in the opening, and a fifth step of abrading the barrier layer to remove part of the barrier layer on the insulating layer while part of the barrier layer on the copper layer in the opening is left, so as to planarize the surface. A wiring layer of copper can be formed without a conventional step of etching a copper layer to leave a wiring layer. Furthermore, the copper wiring layer is coated by layers of barrier materials, whereby oxidation and diffusion of the copper is precluded with a result that planarized wiring layers of high electromigration resistances and low resistances can be formed.

16 Claims, 12 Drawing Sheets

5,470,789

PROCESS FOR FABRICATING INTEGRATED CIRCUIT DEVICES

This application is a continuation of application Ser. No. 08/204,986 filed Mar. 2, 1994, now abandoned.

BACKGROUND OF THE INVENTION

The present invention relates to a process for fabricating an integrated circuit device including wiring layers and contacts formed of copper.

Recently higher integration of integrated circuit devices including aluminium (Al) wiring layers is accompanied by a problem of higher contact resistances due to reduction of contact areas, and problems of degradation of higher resistances and electromigration resistances due to micronization of wiring sizes.

Here is needed a technique of forming micronized wirings and contacts of materials of high electromigration resistances and lower resistances. Copper is noted as a metal material for such wiring.

Conventionally a copper wiring layer has been formed by a process in which a thin film of copper is deposited on the entire surface Of a semiconductor substrate by sputtering or vaporization and then is chemically etched in a required wiring by RIE (Reactive Ion Etching).

But because of low etching speeds due to very low vapor pressures of copper halide generated in the etching step, the usual etching cannot make a patterned profile of the wiring layer clearcut. This has been a problem.

The formation of a coating film on the formed copper wiring layer for the prevention of the oxidation of the copper makes convexities and concavities of the wiring layer large. This has been an obstacle to planarization of the surface.

SUMMARY OF THE INVENTION

An object of the present invention is to provide a process for fabricating and integrated circuit device, which can planarize wiring layers and contacts of copper without vaporizing copper compounds by etching.

The above-described object is achieved by a process for fabricating an integrated circuit device comprising: a first step of forming an opening in an insulating layer formed on a substrate; a second step of depositing a copper layer on the substrate including the opening; a third step of abrading the copper layer to remove the copper layer deposited on the insulating layer, while part of the copper layer deposited in the opening is removed until the upper surface of said part becomes lower than the upper surface of the insulating layer; a fourth step of depositing a barrier layer on the substrate including the copper layer in the opening; and a fifth step of abrading the barrier layer to remove part of the barrier layer on the insulating layer while part of the barrier layer on the copper layer in the opening is left, so as to planarize the surface.

The above-described object is achieved by a process for fabricating an integrated circuit device comprising: a first step of forming an opening in an insulating layer formed on a substrate; a second step of depositing a first barrier layer on the substrate including the opening; a third step of depositing a copper layer on the first barrier layer; a fourth step of abrading the copper layer to remove the copper layer and the first barrier layer deposited on the insulating layer, while part of the copper layer deposited in the opening is removed until the upper surface of said part becomes lower than the upper surface of the insulating layer; a fourth step of depositing a barrier layer on the substrate including the copper layer in the opening; a fifth step of abrading the barrier layer to remove part of the barrier layer on the insulating layer while part of the barrier layer on the copper layer in the opening is left, so as to planarize the surface; and a sixth step of abrading the second barrier layer to remove the second barrier layer on the insulating layer while leaving part of the second barrier layer on the copper layer in the opening, so as to planarize the surface.

In the above-described process for fabricating an integrated circuit device, the opening formed in the insulating layer is a grooved opening, and the copper layer deposited in the grooved opening is a wiring layer.

In the above-described process for fabricating an integrated circuit device, the opening formed in the insulating layer is a contact hole which reaches the substrate, and the copper layer deposited in the contact hole forms a contact with the substrate.

In the above-described process for fabricating an integrated circuit device, the insulating layer is formed of an insulating material containing substantially no oxygen.

In the above-described process for fabricating an integrated circuit device, the insulating material containing substantially no oxygen is silicon nitride or polyimide.

In the above-described process for fabricating an integrated circuit device, the insulating material containing substantially no oxygen is silicon oxide.

In the above-described process for fabricating an integrated circuit device, the third step is for buff-abrading with an aqueous solution of potassium iodine or potassium chloride, and an abrasive agent.

In the above-described process for fabricating an integrated circuit device, the fourth step is for buff-abrading with an aqueous solution of potassium iodine or potassium chloride, and an abrasive agent.

In the above-described process for fabricating an integrated circuit device, the barrier layer is formed of TiN.

According to the present invention, a wiring layer of copper can be formed without a conventional step of etching a copper layer to leave a wiring layer. Furthermore, the copper wiring layer is coated by layers of barrier materials, whereby oxidation and diffusion of the copper is precluded with a result that planarized wiring layers of high electromigration resistances and low resistances can be formed.

DETAILED DESCRIPTION OF THE INVENTION

Figure 1:
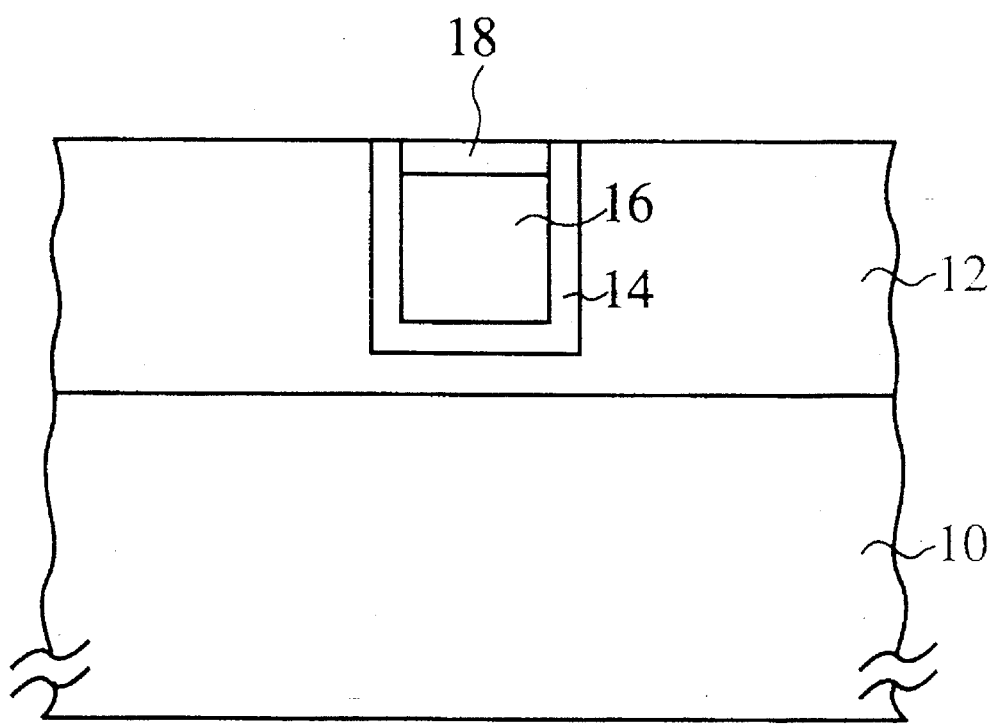
FIG. 1 is a sectional view of the integrated circuit device according to a first embodiment of the present invention.

The integrated circuit device according to a first embodiment of the present invention will be explained with reference to FIG. 1.

The integrated circuit device according to the first embodiment is formed on a substrate 10. In the first embodiment, the substrate 10 includes semiconductor substrates, such as silicon substrates, for semiconductor devices to be formed on, insulating substrates, such as ceramic substrates, for bearing wiring layers, and others. In multi-layer wirings the substrate 10 even includes substrates for bearing wiring layers, such as inter-insulating films of multi-layer wiring.

An insulating layer 12, as of $SiO_2$ or others, is formed on the substrate 10. A barrier layer 14 of, e.g., TiN is formed on the inside surface of an opening formed in the insulating layer 12. A wiring layer 16 of copper is formed on the barrier layer 14. A barrier layer 18 of, e.g., TiN or others is formed on the copper wiring layer 16.

Thus according to this embodiment, the copper wiring layer 16 formed in the insulating layer 12 is all surrounded by the barrier layers 14, 18, and in addition its surface is planarized.

The process for fabricating the integrated circuit device of FIG. 1 will be explained with reference to FIGS. 2A to 2E.

Figure 2A:
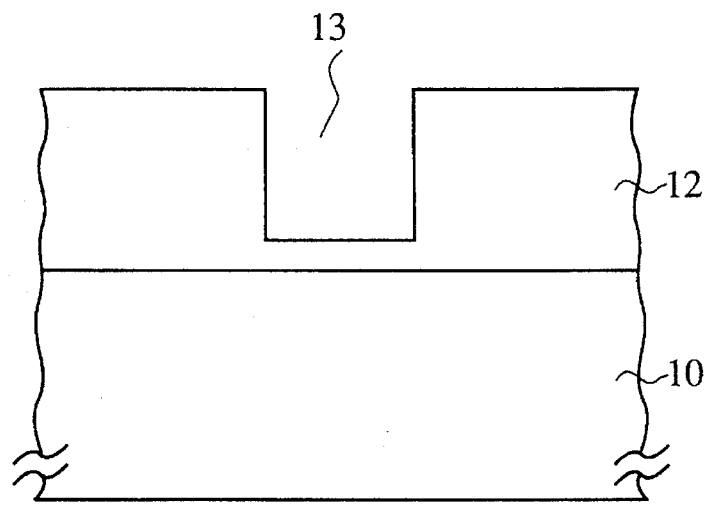
FIGS. 2A to 2E are sectional views of the integrated circuit device according to the first embodiment in steps of the process for fabricating the same.

First, the insulating film 12 is formed on the substrate 10 of, e.g., $SiO_2$. Then, the opening 13 for the copper wiring layer to be formed in is formed by the usual lithography (FIG. 2A).

Figure 2B:
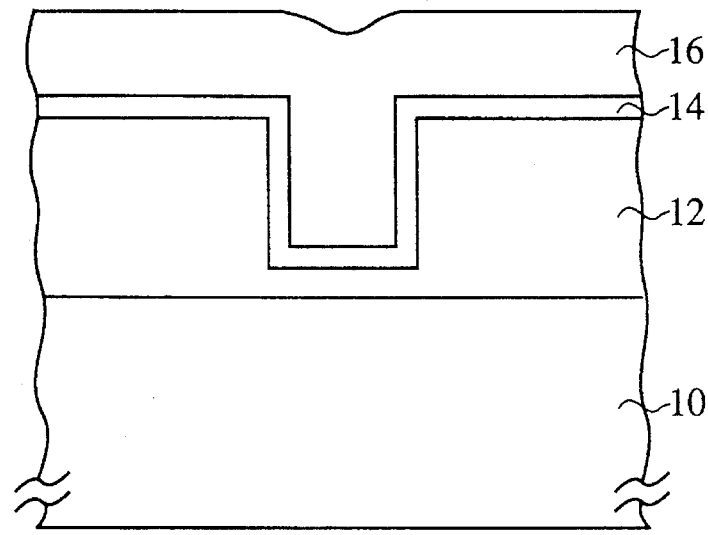

Subsequently TiN is deposited by sputtering on the entire surface of the insulating layer 12 including the inside surface of the opening 13 to form the barrier layer 14 (FIG. 2B).

Then copper is deposited by CVD on the barrier layer 14 to form the wiring layer 16 which completely buries the opening 13 (FIG. 2B):

In the CVD for forming the copper wiring layer (CVD-Cu layer) 16, the source gas is Cu(HFA)tmvs [Cu(I)-hexafluoroacetylacetonato-trimethylvinylsilyl], the substrate temperature is 200° C., and the growth pressure is 1 Torr.

Figure 2C:
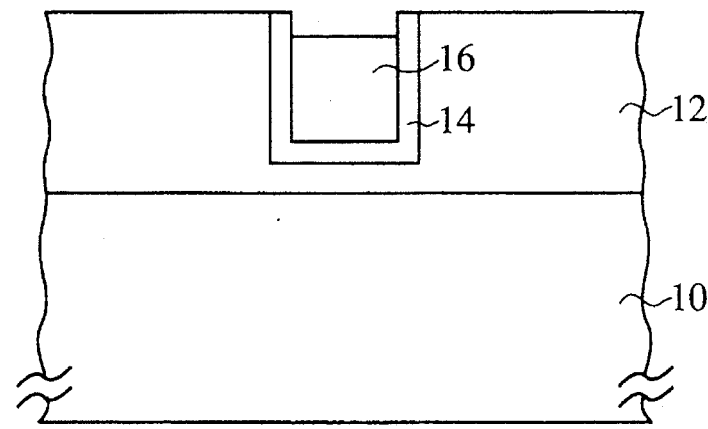

Then, the copper wiring layer 16 is buff-abraded with a mixed aqueous solution (5%) of potassium iodide (KI) and iodine ($I_2$) and an abrasive (trademark "Balkalox" 0.1 CR (0.1 μm-particle size)). The parts of the copper wiring layers 16 and the barrier layer 14 on the insulating layer 16 are removed, and the buff-abrasion is set on until the upper surface of the copper wiring layer 16 becomes lower than the upper surface of the insulating layer 12, and the copper wiring layer 16 is surrounded on the three sides by the barrier layer 14 (FIG. 2C). The buff-abrasion may be conducted with an aqueous solution (10–30%) of potassium chloride (KCl) and an abrasive agent.

Figure 2D:
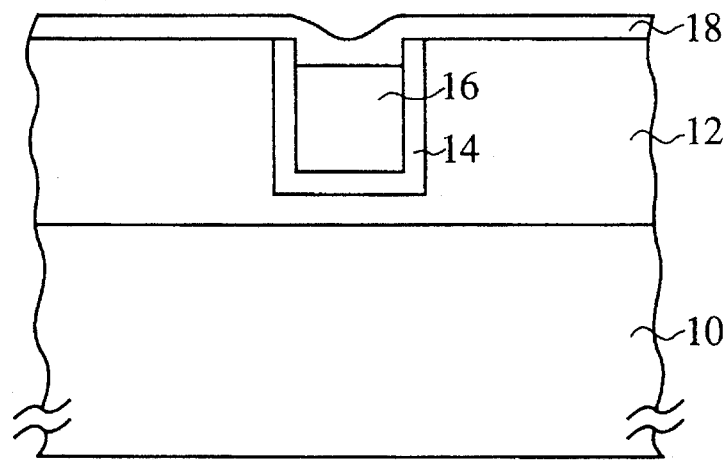

Then, TiN is again deposited by sputtering on the entire surface of the insulating layer 12 including the copper wiring layer 16 lower than the upper surface of the insulating layer 12 to form the barrier layer 18 (FIG. 2D).

Figure 2E:
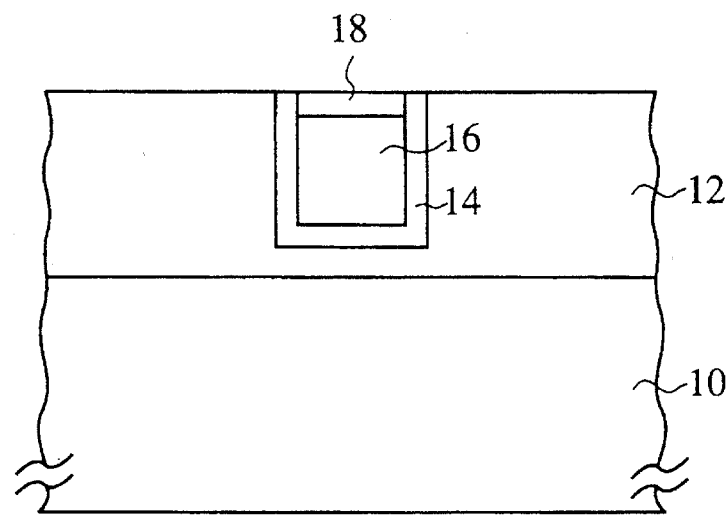

Subsequently the upper surface of the barrier layer 18 is abraded for planarization with a neutral or an alkaline abrasive liquid containing no acid by a hard abrasive cloth so that the upper surface of the insulating layer 12 and that of the barrier layer 18 agree with each other (FIG. 2E).

Resultantly, the copper wiring layer 16 is covered on the upper surface with the barrier layer 18 and on the side surfaces and the bottom surface with the barrier layer 14. Thus the copper wiring layer 16 is surrounded on the four sides by the TiN barrier layers 14, 16.

Continuously another wiring layer can be formed on the insulating layer 12 and the copper wiring layer 16 planarized with each other.

Thus according to the first embodiment, the copper wiring layer can be formed without conventionally etching a copper layer to leave a wiring layer. Furthermore, because of the copper wiring layer surrounded by the barrier layers, oxidation and diffusion of the copper can be precluded, and the surface of the copper wiring layer can be planarized.

Figure 3:
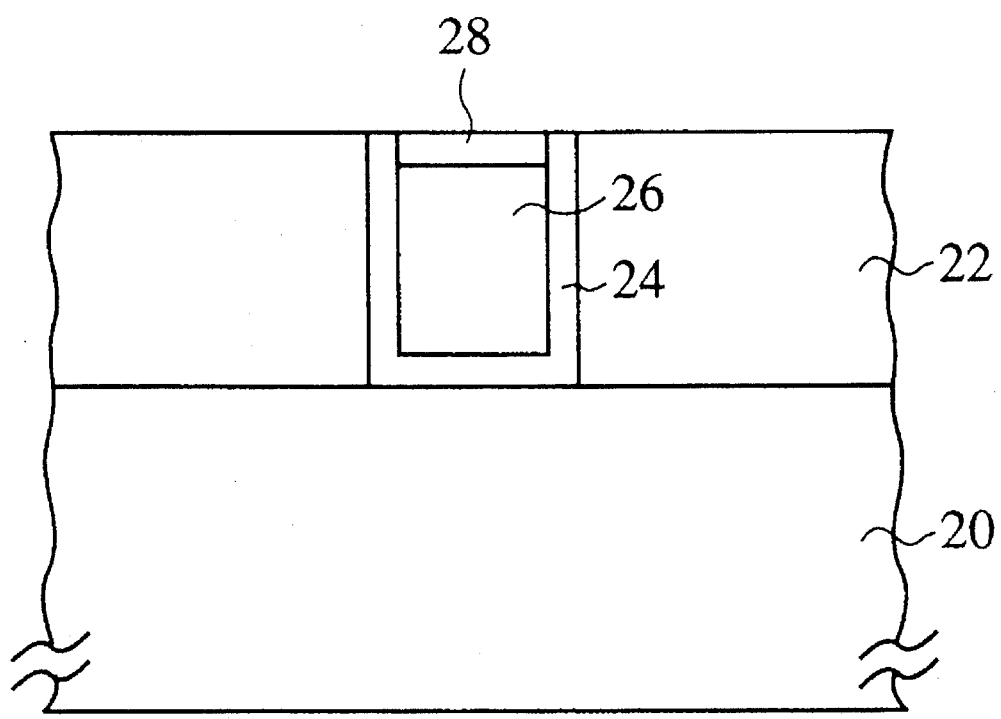
FIG. 3 is a sectional view of the integrated circuit device according to a second embodiment of the present invention.

The integrated circuit device according to a second embodiment of the present invention will be explained with reference to FIG. 3.

The integrated circuit device according to the second embodiment is formed on a substrate 20. In the second embodiment, the substrate 20 includes semiconductor substrates, such as silicon substrates, for semiconductor devices to be formed on, insulating substrates, such as ceramic substrates, for bearing wiring layers, and others. In multi-layer wirings the substrate 20 even includes lower wiring layers which are formed below the substrate.

An insulating layer 22, as of $SiO_2$ or others, is formed on the substrate 20. A barrier layer 24 of, e.g., TiN is formed on the inside surface of a contact hole formed in the insulating layer 22. A contact layer 26 of copper is formed on the barrier layer 24. A barrier layer 28 of, e.g., TiN or others is formed on the copper contact layer 26.

Thus according to this embodiment, the copper contact layer 26 formed in the insulating layer 22 is all surrounded by the barrier layers 24, 28 and contacted with the substrate 20, and has the surface planarized.

The process for fabricating the integrated circuit device of FIG. 3 will be explained with reference to FIGS. 4A to 4E.

Figure 4A:
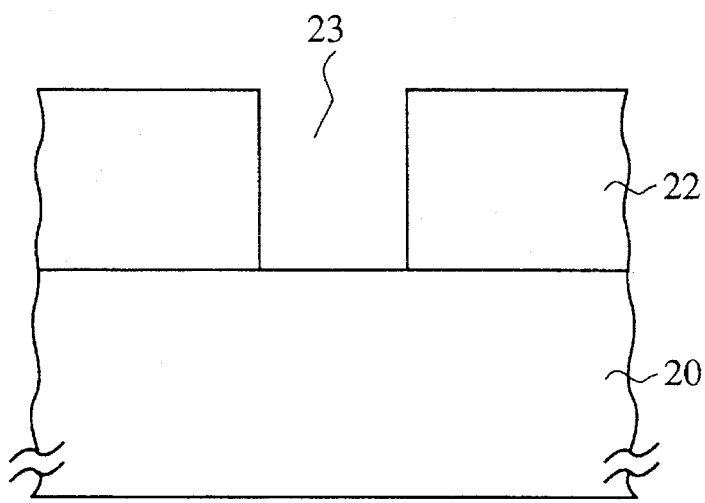
FIGS. 4A to 4E are sectional views of the integrated circuit device according to the second embodiment in steps of the process for fabricating the same.

First, the insulating film 22 is formed on the substrate 20 of, e.g., $SiO_2$. Then, the contact hole 23 for the copper contact layer to be formed in is formed in the insulating layer 22 by the usual lithography to expose the surface of the substrate 20 (FIG. 4A).

Figure 4B:
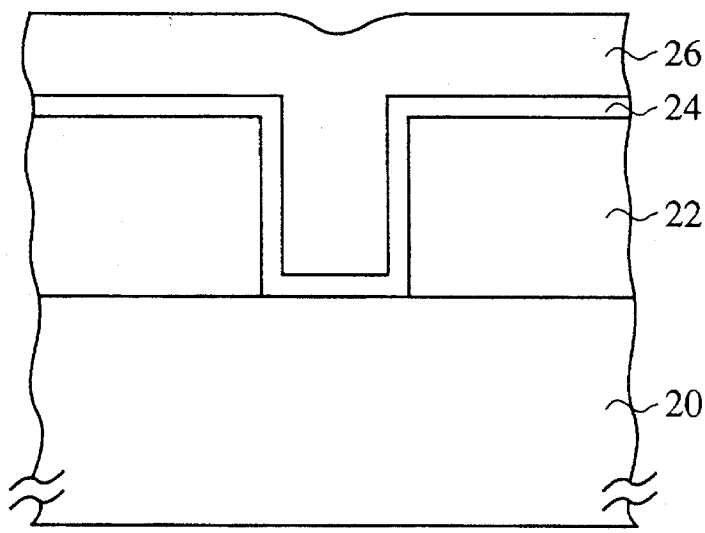

Subsequently TiN is deposited by sputtering on the entire surface of the insulating layer 22 including the inside surface of the contact hole 23 to form the barrier layer 24 (FIG. 4B).

Then copper is deposited on the barrier layer 24 by CVD to form the contact layer 26 which completely buries the contact hole 23 (FIG. 4B).

Figure 4C:
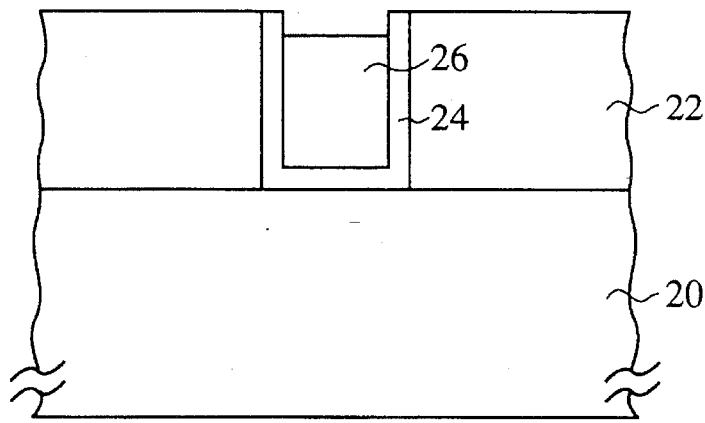

Then, the copper contact layer 26 is buff-abraded with a mixed solution (5%) of potassium iodide (KI), iodine ($I_2$) and diluted nitric acid, and an abrasive. The parts of the copper contact layer 26 and the barrier layer 24 on the insulating layer 22 are removed, and the buff-abrasion is set on until the upper surface of the copper contact layer 26 becomes lower than the upper surface of the insulating layer 22, and the copper contact layer 26 is surrounded on the three sides by the barrier layer 24 (FIG. 4C).

Figure 4D:
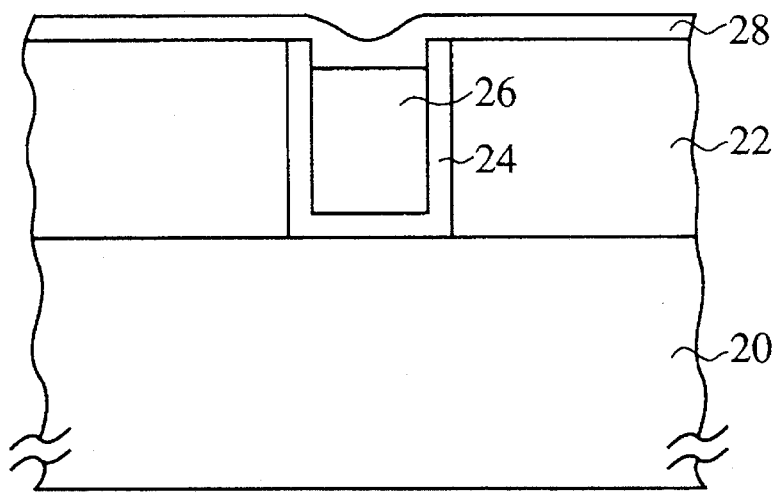

Then, TiN is again deposited by sputtering on the entire surface of the insulating layer 22 including the copper contact layer 26 lower than the upper surface of the insulating layer 22 to form the barrier layer 28 (FIG. 4D).

Figure 4E:
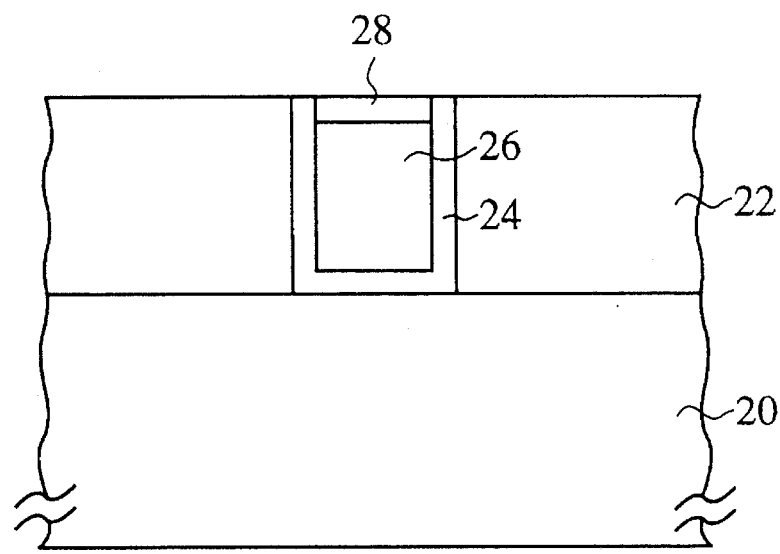

Subsequently the upper surface of the barrier layer 28 is abraded for planarization with a neutral or an alkaline abrasive liquid containing no acid by a hard abrasive cloth so that the upper surface of the insulating layer 22 and that of the barrier layer 18 agree with each other (FIG. 4E).

Resultantly, the copper contact layer 26 is covered on the upper surface with the barrier layer 28 and on the side surfaces and the bottom surface with the barrier layer 24. Thus the copper contact layer 26 is surrounded on the four sides by the TiN barrier layers 24, 26.

Continuously another copper contact layer can be formed on the insulating layer 22 and the copper contact layer 26 planarized with each other.

Thus according to the second embodiment, the copper contact layer can be formed without conventionally etching a copper layer to leave a contact layer. Furthermore, because of the copper contact layer surrounded by the barrier layers, oxidation and diffusion of the copper can be precluded, and contact layers of high electromigration resistances and low resistances can be formed.

Furthermore, even though the contact layer is formed of copper, its surface can be planarized. Accordingly wiring layers formed on copper contact layers, and the substrate can be electrically connected.

The integrated circuit device according to a third embodiment of the present invention will be explained with reference to FIG. 3.

The third embodiment uses as an insulating layer an insulating material, such as silicon nitride (SiN), polyimide or others. In the first embodiment described above, the copper wiring layer is all surrounded by the barrier layers of TiN, but in the case that the insulating layer is formed of an insulating material containing substantially no oxygen, such as silicon nitride, polyimide or others, it is not necessary to form the barrier layers on the bottom surface and the side surfaces of the copper wiring layer because the copper wiring layer is not oxidized by the insulating layer.

The integrated circuit device according to the third embodiment is formed on a substrate 30. In the third embodiment, the substrate 30 includes semiconductor substrates, such as silicon substrates, for semiconductor devices to be formed on, insulating substrates, such as ceramic substrates, for bearing wiring layers, and others. In multi-layer wirings the substrate 10 even includes substrates for bearing wiring layers, such as inter-insulating films of multi-layer wiring.

An insulating layer 32 of an insulating material containing substantially no oxygen, such as silicon nitride, polyimide or others, is formed on the substrate 30. A wiring layer 36 of copper is formed in an opening formed in the insulating layer 32, and a barrier layer 38 of TiN or others is formed on the copper wiring layer 36.

Thus according to the third embodiment, the upper surface of the copper wiring layer 36 formed in the insulating layer 32 is covered with the barrier layer 38, and its surface is planarized.

Figure 5:
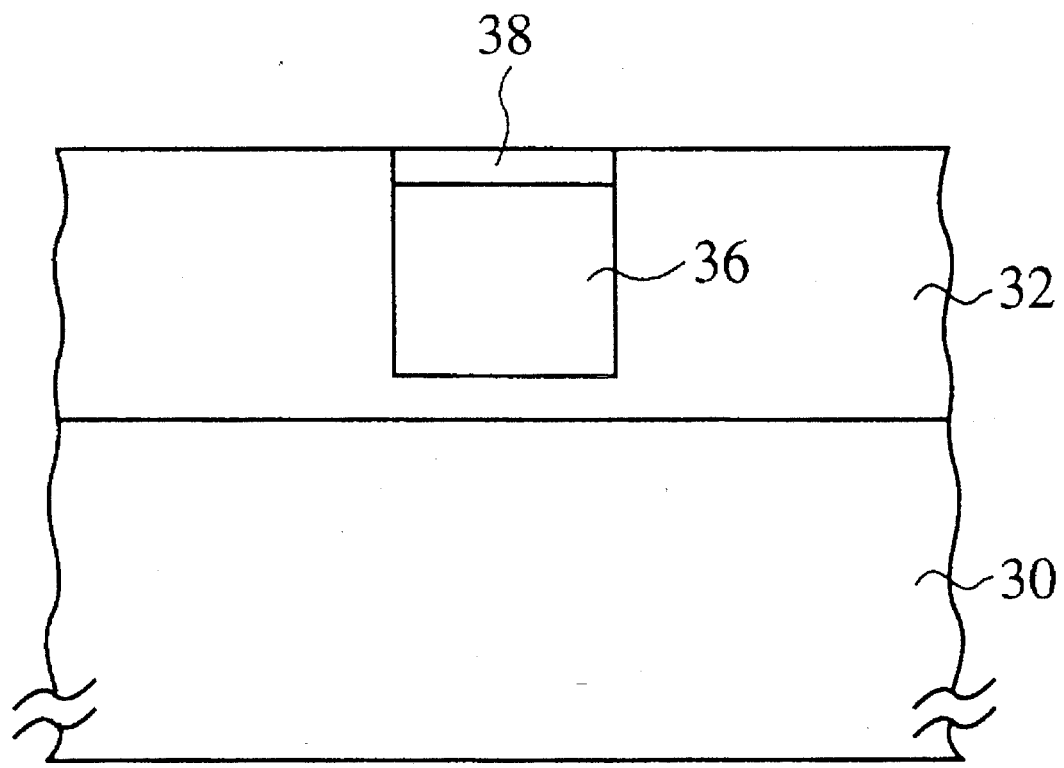
FIG. 5 is a sectional view of the integrated circuit device according to a third embodiment of the present invention.

The process for fabricating the integrated circuit device of FIG. 5 will be explained with reference to FIGS. 6A to 6E.

Figure 6A:
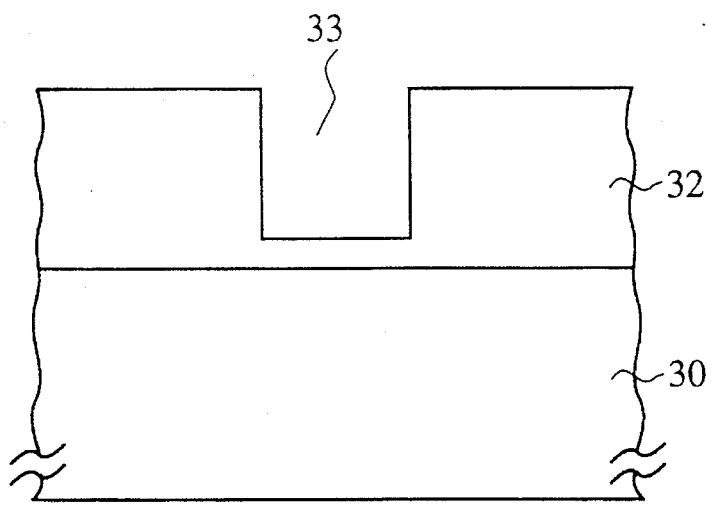
FIGS. 6A to 6E are sectional views of the integrated circuit device according to the third embodiment in steps of the process for fabricating the same.

First, the insulating layer 32 of silicon nitride, polyimide or others is deposited on the substrate 30. Then an opening 32 for the copper wiring layer to be formed in is formed in the insulating layer 32 by the usual photolithography (FIG. 6A).

Figure 6B:
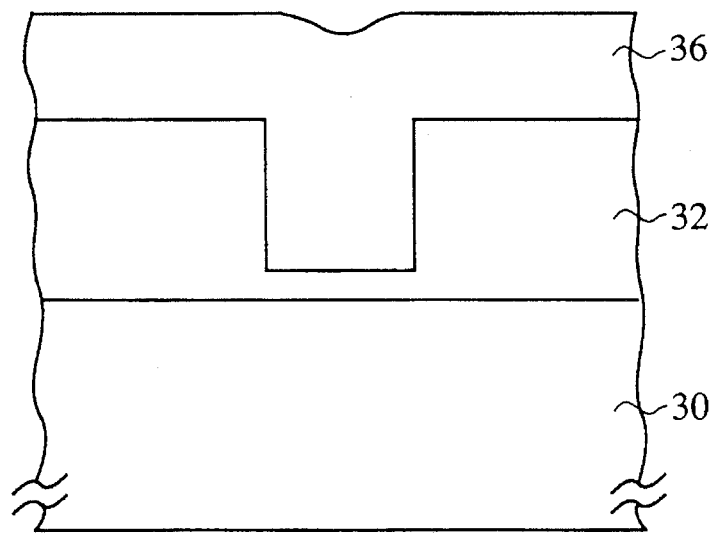

Then copper is deposited on the entire surface of the insulating layer 32 including the inside surface of the opening 33 by CVD to form the copper wiring layer 36 which completely buries the opening 33 (FIG. 6B).

Figure 6C:
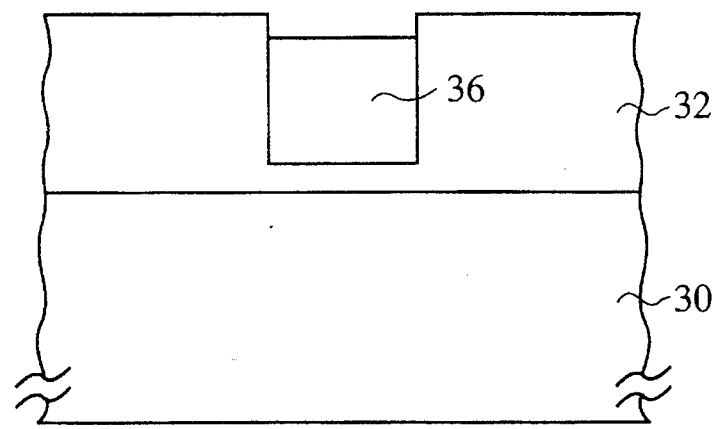

Next, the copper wiring layer 36 is buff-abraded with a mixed aqueous solution (5%) of potassium iodine (KI) and iodine ($I_2$), and an abrasive agent. The part of the copper wiring layer 36 on the insulating layer 32 is removed, and the buff-abrasion is set On until the upper surface of the copper wiring layer 36 becomes lower than the upper surface of the insulating layer 32 (FIG. 6C).

Figure 6D:
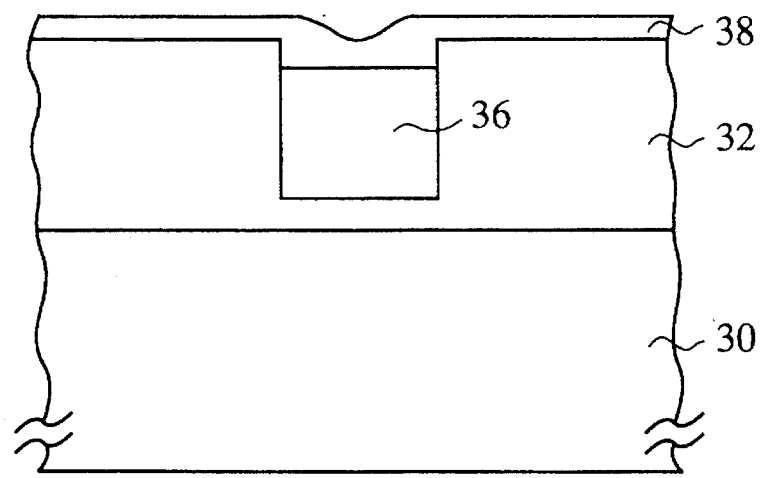

Then, TiN is deposited by CVD on the entire surface of the insulating layer 32 to form the barrier layer 38 (FIG. 6D).

Figure 6E:
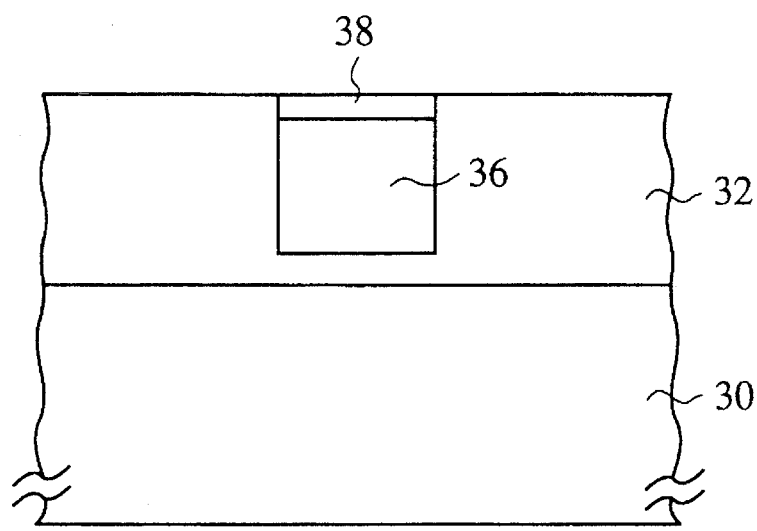

Subsequently the upper surface of the barrier layer 38 is abraded for planarization with a neutral or an alkaline abrasive liquid containing no acid and a hard abrasive cloth so that the upper surface of the insulating layer 32 and that of the barrier 88 agree with each other (FIG. 6E).

Resultantly the copper wiring layer 36 is covered on the upper surface with the barrier layer 38, and on the bottom and the side surfaces with the insulating layer 32 of an insulating material, such as silicon nitride, polyimide or others containing substantially no oxygen.

Continuously another wiring layer can be formed on the insulating layer 32 and the copper wiring layer 36 planarized with each other.

Thus according to the third embodiment, the copper wiring layer can be formed without conventionally etching a copper layer to leave a wiring layer. Furthermore, because of the copper wiring layer surrounded by the layers of materials containing substantially no oxygen, oxidation and diffusion of the copper can be precluded, and wiring layers of high electromigration resistances and low resistances can be formed. Furthermore, even though the wiring layer is formed of copper, its surface can be planarized.

Figure 7:
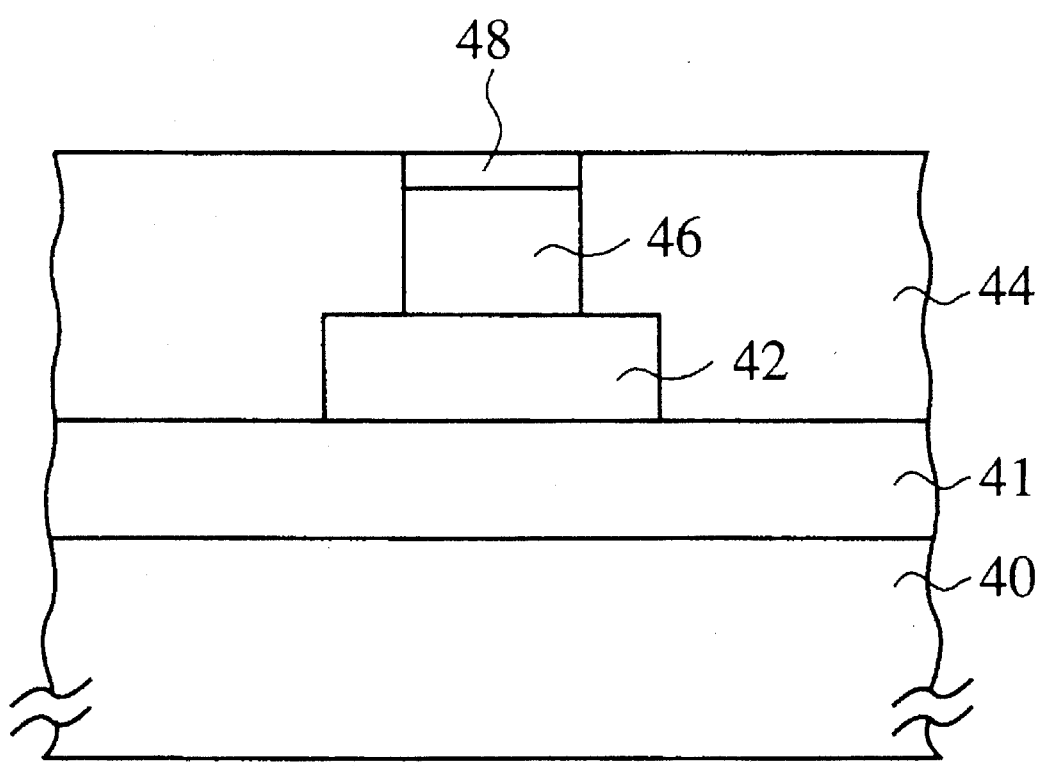
FIG. 7 is a sectional view of the integrated circuit device according to a fourth embodiment of the present invention.

The integrated circuit device according to a fourth embodiment of the present invention will be explained with reference to FIG. 7.

The integrated circuit device according to the fourth embodiment is formed on a substrate 40.

In this embodiment the substrate 40 includes semiconductor substrates, such as silicon substrates, etc. for semiconductor devices to be formed on, and insulating substrates, etc., such as ceramic substrates bearing wiring layers.

A lower wiring layer 42 of aluminium is formed on the substrate 40 through an insulating layer 42 of, e.g., $SiO_2$. An insulating layer 44 of an insulating material containing substantially no oxygen, such as silicon nitride, polyimide or others is formed on the wiring layer 52. A contact layer of copper 46 is burled in a contact hole formed in the insulating layer 44, and ta barrier layer 48 of, e.g., TiN is formed on the copper contact layer 46.

Thus, according to the fourth embodiment, the copper contact layer 46 formed in the insulating layer 44 is coated on the upper surface with the barrier layer 48, on the side surfaces with the insulating layer 44 of an insulating material containing substantially no oxygen. The copper contact layer 46 is contacted with the substrate 40, and has the upper surface planarized.

The process for fabricating the integrated circuit device of FIG. 7 will be explained with reference to FIGS. 8A to 8E.

Figure 8A:
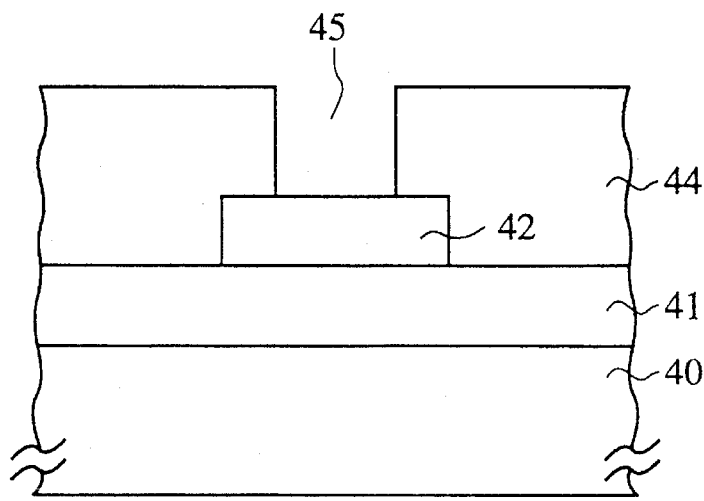
FIGS. 8A to 8E are sectional views of the integrated circuit device according to the fourth embodiment in steps of the process for fabricating the same.

First, an insulating layer 41 of, e.g., $SiO_2$ is formed on a substrate 40. Then a wiring layer 42 of aluminium is deposited on the insulating layer 41, and is patterned as a lower wiring layer 42. Subsequently an insulating material containing substantially no oxygen, such as silicon nitride, polyimide or others is deposited on the entire surface to form the insulating layer 44. Then a contact hole 45 for the copper contact layer to be formed in is formed by the usual photolithography to expose the surface of the lower wiring layer 42 (FIG. 8A).

Figure 8B:
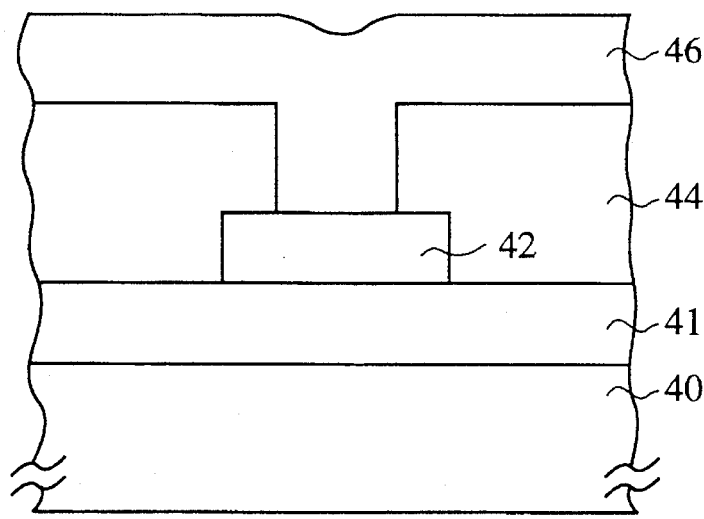

Then copper is deposited on the entire surface of the insulating layer 44 including the exposed surface of the wiring layer 42 and the inside surface of the contact hole 45 to form the copper contact layer 46 which completely buries the contact hole 45 (FIG. 8B).

Figure 8C:
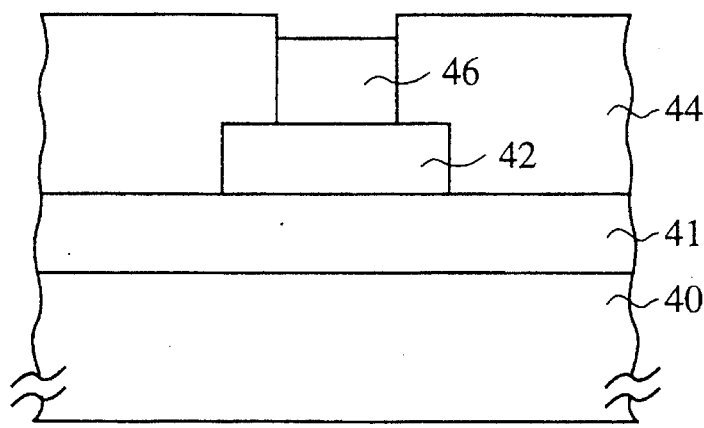

Then, the copper contact layer 46 is buff-abraded with a mixed solution (5%) of potassium iodine (KI), iodine ($I_2$) and diluted nitric acid, and an abrasive agent. The part of the copper contact layer 46 on the insulating layer 44 is removed. The buff-abrasion is set on until the upper surface of the copper contact layer 46 becomes lower than that of the insulating layer 44, and the copper contact layer 46 is formed (FIG. 8C).

Figure 8D:
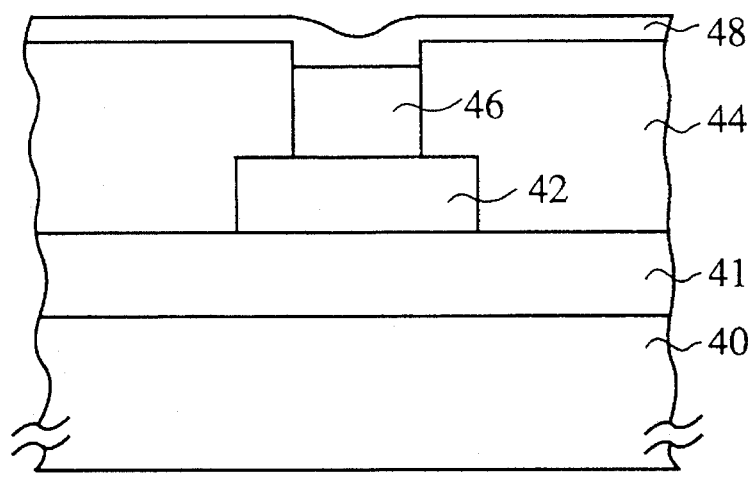

Next, Tin is deposited by sputtering on the entire surface of the insulating layer 44 including the copper contact layer 46 lower than the upper surface of the insulating layer 44 to form the barrier layer 48 (FIG. 8D).

Figure 8E:
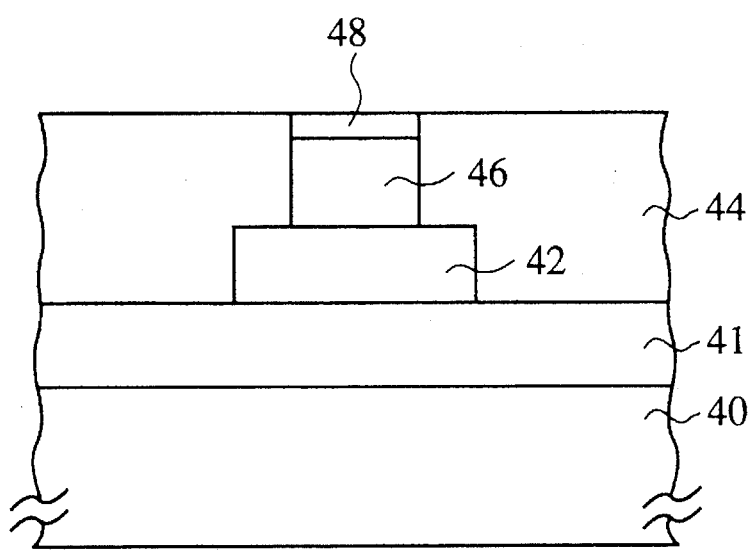

Then, the upper surface of the barrier layer 48 is abraded for planarization with a neutral or an alkaline abrasive liquid containing substantially no oxygen and a hard abrasive cloth so that the upper surface of the insulating layer 44 and that of the barrier layer 48 agree with each other (FIG. 8E).

Resultantly the copper contact layer 46 has the upper surface coated with the barrier layer 48.

Continuously another wiring layer can be formed on the insulating layer 44 and the copper contact layer 46 planarized with each other.

Thus according to the fourth embodiment, the copper wiring layer can be formed without conventionally etching a copper layer to leave a wiring layer. Furthermore, because of the copper wiring layer surrounded by the layers of materials containing substantially no oxygen, oxidation and diffusion of the copper can be precluded, and wiring layers of high electromigration resistances and low resistances can be formed. Furthermore, even though the wiring layer is formed of copper, its surface can be planarized.

What is claimed is:

1. A process for fabricating an integrated circuit device comprising:

a first step of forming an opening in an insulating layer formed on a substrate;

a second step of depositing a copper layer on the substrate including the opening;

a third step of abrading the copper layer to remove the copper layer deposited on the insulating layer, while part of the copper layer deposited in the opening is removed until the upper surface of the copper layer deposited in the opening becomes lower then the upper surface of the insulating layer;

a fourth step of depositing a barrier layer on the substrate including the copper layer in the opening; and a fifth step of abrading the barrier layer to remove part of the barrier layer on the insulating layer while part of the barrier layer on the copper layer in the opening is left, so as to planarize the surface.

2. A process for fabricating an integrated circuit device according to claim 1, wherein the opening formed in the insulating layer is a grooved opening, and the copper layer deposited in the grooved opening is a wiring layer.

3. A process for fabricating an integrated circuit device according to claim 1, wherein the opening formed in the insulating layer is a contact hole which reaches the substrate, and the copper layer deposited in the contact hole forms a contact with the substrate.

4. A process for fabricating an integrated circuit device according to claim 1, wherein the insulating layer is formed of an insulating material containing no oxygen.

5. A process for fabricating an integrated circuit device according to claim 4, wherein the insulating material containing no oxygen is silicon nitride or polyimide.

6. A process for fabricating an integrated circuit device according to claim 1, wherein the barrier layer is formed of TiN.

7. A process for fabricating an integrated circuit device according to claim 1, wherein the third is for buff-abrading with an aqueous solution of potassium iodine or potassium chloride, and an abrasive agent.

8. The process for fabricating an integrated circuit device according to claim 1, wherein said fifth step of abrading the barrier layer includes abrading with a neutral abrasive liquid.

9. The process for fabricating an integrated circuit device according to claim 1, wherein said fifth step of abrading the barrier layer includes abrading with a hard abrasive cloth.

10. A process for fabricating an integrated circuit device comprising:

a first step of forming an opening in an insulating layer formed on a substrate;

a second step of depositing a first barrier layer on the substrate including the opening;

a third step of depositing a copper layer on the first barrier layer;

a fourth step of abrading the copper layer to remove the copper layer and the first barrier layer deposited on the insulating layer, while part of the copper layer deposited in the opening is removed until the upper surface of the copper layer deposited in the opening becomes lower than the upper surface of the insulating layer;

a fifth step of depositing a second barrier layer on the substrate including the copper layer in the opening; and a sixth step of abrading the second barrier layer to remove the second barrier layer on the insulating layer while leaving part of the second barrier layer on the copper layer in the opening, so as to planarize the surface.

11. A process for fabricating an integrated circuit device according to claim 10, wherein the opening formed in the insulating layer is a grooved opening, and the copper layer deposited in the grooved opening is a wiring layer.

12. A process for fabricating an integrated circuit device according to claim 10, wherein the opening formed in the insulating layer is a contact hole which reaches the substrate, and the copper layer deposited in the contact hole forms a contact with the substrate.

13. A process for fabricating an integrated circuit device according to claim 10, wherein the insulating layer is formed of an insulating material containing oxygen.

14. A process for fabricating an integrated circuit device according to claim 13, wherein the insulating material containing oxygen is silicon oxide.

15. A process for fabricating an integrated circuit device according to claim 10,
    wherein the barrier layer is formed of TiN.

16. A process for fabricating an integrated circuit device according to claim 10,
    wherein the fourth step is for buff-abrading with an aqueous solution of potassium iodine or potassium chloride, and an abrasive agent.

* * * * *